United States Patent [19]
Olson et al.

[11] Patent Number: 5,386,341
[45] Date of Patent: Jan. 31, 1995

[54] FLEXIBLE SUBSTRATE FOLDED IN A U-SHAPE WITH A RIGIDIZER PLATE LOCATED IN THE NOTCH OF THE U-SHAPE

[75] Inventors: William L. Olson, Lindenhurst; David W. Currier, Algonquin; Tomasz L. Klosowiak, Glenview; Mark Fulcher, Hanover Park, all of Ill.

[73] Assignee: Motorola, Inc., Schaumburg, Ill.

[21] Appl. No.: 143,594

[22] Filed: Nov. 1, 1993

[51] Int. Cl.⁶ .......................... H05K 7/20; H05K 1/00
[52] U.S. Cl. ........................ 361/749; 174/252; 174/254; 361/704; 361/707; 361/710; 361/711; 361/719; 361/720; 361/760; 361/807; 361/792; 361/809; 361/810; 439/66
[58] Field of Search ............... 174/252, 254; 361/704, 361/707, 710, 711, 712, 713, 719, 720, 721, 749, 760, 792, 793, 794, 795, 807, 809, 810; 439/66, 91, 67, 77, 485

[56] References Cited

U.S. PATENT DOCUMENTS

| | | | |
|---|---|---|---|
| 3,967,162 | 6/1976 | Ceresa et al. | 174/252 |
| 4,495,546 | 1/1985 | Nakamura et al. | 361/749 |
| 4,792,879 | 12/1988 | Bauknecht et al. | 361/749 |
| 4,811,165 | 3/1989 | Currier et al. | 361/707 |
| 5,007,842 | 4/1991 | Deak et al. | 439/66 |
| 5,101,322 | 3/1992 | Ghaem et al. | 361/707 |

FOREIGN PATENT DOCUMENTS

0065425 11/1982 European Pat. Off. ............ 361/749

OTHER PUBLICATIONS

Electronic Packaging and Production May 1992 p. 46.

*Primary Examiner*—Leo P. Picard
*Assistant Examiner*—Donald A. Sparks
*Attorney, Agent, or Firm*—Phillip H. Melamed

[57] ABSTRACT

Semiconductor carrier assemblies (10, 40) use a flexible substrate (11) to connect to at least one semiconductor device (19). Preferably the flexible substrate (11) also connects to a circuit component, preferably a circuit board (31). The flexible substrate (11) is configured in a U-shaped configuration having at least one rigidizer plate (25; 41, 42) positioned in the notch of the U. Interconnections between the semiconductor device (19) and the flexible substrate (11), and, preferably, the circuit component (31) are provided by solder connections (22, 28). Preferably, two rigidizer plates (41,42) having different temperature coefficients of expansion are positioned in the notch of the U of the flexible substrate (11) and preferably a low modulus adhesive layer (50, 51, 47) is utilized in the assembly to minimize thermal stress.

24 Claims, 1 Drawing Sheet

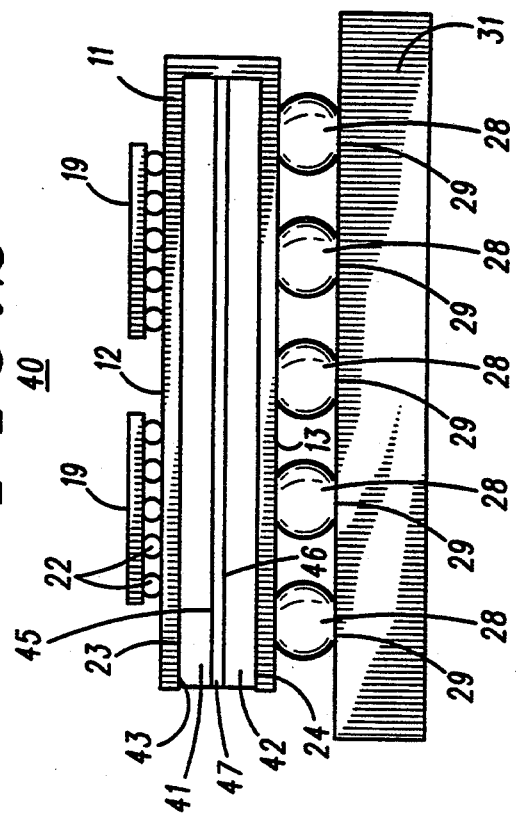
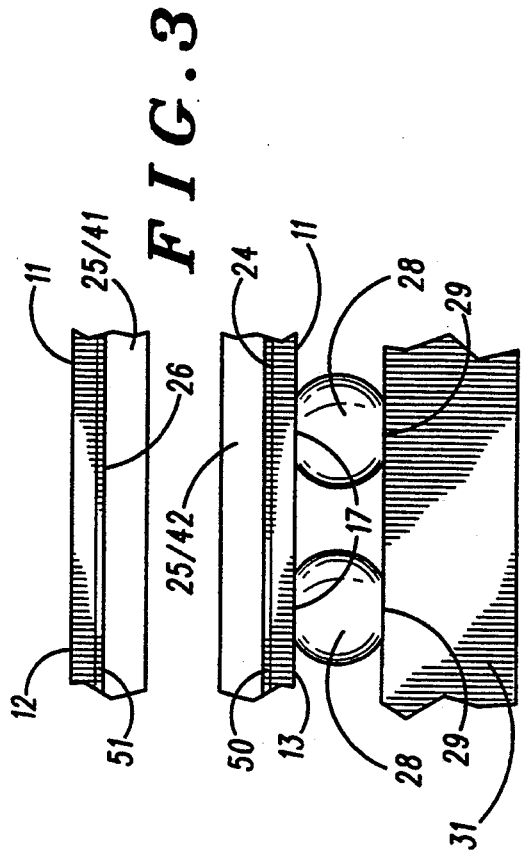
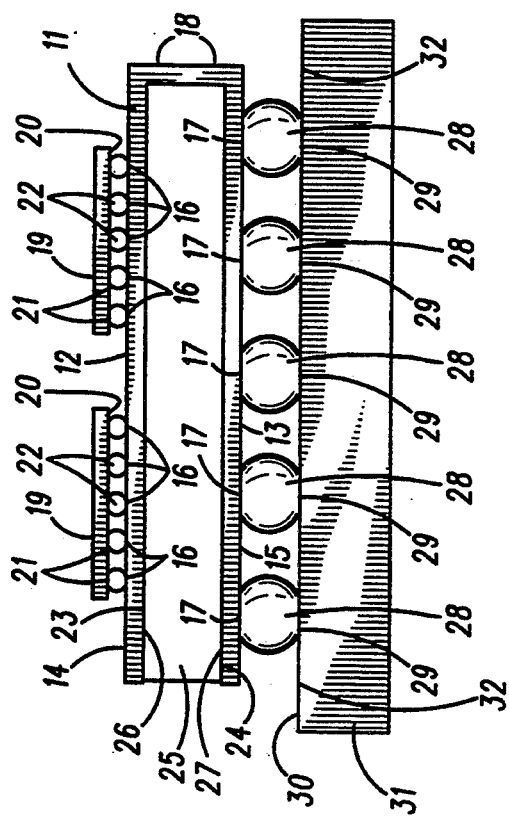

FLEXIBLE SUBSTRATE FOLDED IN A U-SHAPE WITH A RIGIDIZER PLATE LOCATED IN THE NOTCH OF THE U-SHAPE

FIELD OF THE INVENTION

The present invention relates to me field of semiconductor carrier assemblies and can be particularly useful in connection with providing semiconductor die carrier assemblies connecting semiconductor die to printed circuit boards.

BACKGROUND OF THE INVENTION

Many times it is desirable to interconnect a semiconductor device, either in leaded form or as a semiconductor die, to a printed circuit board while providing a carrier structure for the semiconductor device or die to serve as an interim carrier to facilitate mounting the semiconductor device or die to the printed circuit board. In the field of semiconductor die carriers, various different types of semiconductor carriers have been proposed including LID's (leadless inverted devices). In a LID, a semiconductor die is first mounted in a carrier, and then the carrier is inverted and the carrier has bonding pads that subsequently mate with bonding pad areas on a printed circuit board. Generally these LID carriers are complex to construct and the mounting and assembly of them may not provide sufficient heat sinking capabilities for the semiconductor device.

Another method of mounting semiconductor die directly to a circuit board is by using flip chip technology in which bonding pads on the semiconductor die top surface are connected via small solder balls or bumps to solderable bonding pads on the printed circuit board. The problems inherent in such a system is that extremely close tolerances must be provided on the circuit board to facilitate the connection of the very small bonding pads on the semiconductor die to corresponding small bonding pads on the circuit board thus requiring very high resolution for conductive paths and bonding pads on the circuit board.

An interim solution to some of the structures discussed above is the providing of a semiconductor die carrier which will directly interface to the semiconductor die bonding pads, as in the case of a flip chip, but wherein subsequent connection to a much larger and more easily manufactured printed circuit board is achieved by having much larger bonding pads on the carrier connected to much larger printed circuit board bonding pads via much larger solder ball connections. These types of assemblies are generally referred to as grid ball array assemblies. In some grid ball array assemblies a semiconductor die is mounted on top of a carrier structure and electrical connections from the semiconductor device are provided to bottom side solder bumps on the carrier by means of plated through holes or other types of through hole connections in the carrier circuit board. One such technique comprises an overmolded pad array carrier structure in which the carrier actually comprises an epoxy circuit board having through hole connections. Other carriers which utilize a ceramic carrier having through hole connections are referred to as "Cerpac" carriers.

In the above type of carriers, the providing of through hole connections can add to the cost of the entire assembly. Also, there can be potential reliability problems with respect to the through hole connections unless there are stringent and costly controls on the through hole connection materials and processes. What is needed is an inexpensive, more manufacturable and reliable type of semiconductor assembly which preferably eliminates the need for through hole connections, while providing the advantages of having a carrier for a delicate semiconductor device. Preferably, such an improved carrier should also have good thermal conductivity characteristics and be able to reliably withstand large temperature variations.

BRIEF DESCRIPTION OF THE DRAWINGS

The present invention can better be understood by reference to the drawings in which;

FIG. 1 is a side view of a semiconductor carrier assembly;

FIG. 2 is a side view of a modification of the semiconductor carrier assembly shown in FIG. 1; and FIG. 3 is an enlarged side view of a portion of the semiconductor assemblies shown in FIGS. 1 and 2.

DESCRIPTION OF THE PREFERRED EMBODIMENTS

Referring to FIG. 1, a side view of a semiconductor carrier assembly 10 is illustrated. The assembly comprises a flexible substrate 11, preferably having a polyimide insulating base with metalization paths provided thereon. The flexible substrate 11 has a first portion 12 and a second portion 13 and each of the first and second portions has a respective top surface, 14 and 15, with a plurality of electrically isolated and solderable metalized areas 16 and 17 thereon. At least some of the solderable areas 16 are electrically interconnected to the solderable areas 17 through various conductor paths 18 provided on the flexible substrate 11.

For the assembly 10 shown in FIG. 1, two semiconductor devices (die) 19 are illustrated. Each of the die, shown inverted in FIG. 1, has a nominal surface 20 on which a plurality of metalized bonding pads 21 is provided. Each of the bonding pads is mechanically and electrically connected by a solder ball connection 22 to an associated one of the metalized areas 16 on the flexible substrate 11 top surface 14. Preferably the solder ball connections 22 comprises high temperature solder connections such as 95/5 or 90/10 lead tin solder which are formed as bumps on the die 19. The connection of an integrated circuit or semiconductor die, such as the die 19 shown in FIG. 1, to metalized areas 16 on a circuit board via solder ball connections is conventional in the semiconductor assembly art and thus no additional details concerning this portion of the semiconductor carrier assembly will be noted. Each of the portions 12 and 13 of the flexible substrate 1 has an associated bottom surface 23 and 24, respectively, as shown in FIG. 1.

For the assembly 10 shown in FIG. 1, a first rigidizer plate 25 is provided which comprises a rigid metal plate of preferably substantial heat conducting capacity and thermal conducting properties. The bottom surface 23 of the first portion 12 of the flexible substrate 11 is bonded to a planar top surface 26 of the rigidizer plate 25, and a bottom planar surface 27 of the rigidizer plate is bonded to the bottom surface 24 of the second portion 13 of the flexible substrate 11. This results in the bottom surface 24 of the second portion 13 of the flexible substrate 11 facing and being spaced apart from the bottom surface 23 of the first portion 12 of the flexible substrate 11 and results in the flexible substrate therefore having a generally U-shaped configuration with the rigidizer plate 25 being positioned in the notch of the U.

Each of the plurality of metalized areas 17 on the second portion 13 of the flexible substrate 11 is electrically connected and bonded via an associated solder ball connection 28 to a solderable metalized bonding pad 29 on a top surface 30 of a printed circuit board 31. Preferably the solder ball connections 28 also comprise high temperature solder. Preferably each of the solder ball connections 22 and 28 are connected to the substrate 11 and circuit board 31 by low temperature solder (60/40 lead tin solder). The circuit board 31 comprises, preferably, a conventional printed circuit board of glass epoxy or ceramic construction having a plurality of conductive paths 32 on the top surface 30 wherein portions of these conductive paths form the bonding pads 29. The circuit board rod surface 30 is adjacent and parallel to the top surface 15 of the flexible substrate 11.

Referring now to FIG. 2, a semiconductor carrier assembly 40 is illustrated which substantially corresponds to the carrier assembly 10 shown in FIG. 1 except that the first rigidizer plate 25 now comprises separate rigidizer plates 41' and 42 with a top surface 43 of the rigidizer plate 41 being bonded to the bottom surface 23 of the flexible substrate first portion and a bottom surface 44 of the rigidizer plate 42 being bonded to the bottom surface 24 of the second portion 13 of the flexible substrate 11. The plates 41 and 42 are adjacent to and substantially parallel to each other and each has a major planar surface (45 and 46) parallel to and facing one another. In FIGS. 1 and 2, and also in FIG. 3, identical reference numbers are utilized to refer to identical corresponding components of the structures shown therein.

It should be noted that the temperature coefficient of expansion (TCE) of the rigidizer plate 41 substantially matches the temperature coefficient of expansion of the semiconductor die 19 while the temperature coefficient of expansion (TCE) of the rigidizer plate 42 is substantially different from the TCE of the plate 41 and substantially matches the temperature coefficient expansion of the circuit board 31 shown in FIG. 2. The TCE of the die 19 substantially differs from the TCE of circuit board 31. Also, the rigidizer plates 41 and 42 are preferably bonded to one another by the providing of a low modulus adhesive layer 47 positioned between and bonding the major planar surfaces 45 and 46 of the rigidizer plates 41 and 42. Thus the assembly 40 is equivalent to the assembly 10 shown in FIG. 1 except that the single rigidizer plate 25 has now been replaced by a multiple rigidizer plate structure comprising the two rigidizer plates 41 and 42 having substantially different temperature coefficients of expansion.

The reason for the difference between the temperature coefficients of expansion of the plates 41 and 42 is to enhance the reliability of the assembly 40 by insuring that the rigidizer plate 41 closest to the semiconductor devices 19 will match their temperature coefficients of expansion, while the rigidizer plate 42 closest to the conventional printed circuit board 31 will more closely match the circuit board 31 temperature coefficient of expansion. If only a single rigidizer plate 25 had been provided, such as in FIG. 1, it is possible that too great a difference in thermal expansion coefficients might exist between the semiconductor devices 19, the rigidizer plate, and the circuit board 31. Any potential problems that this substantial difference in TCE's might create is minimized by utilization of the structure shown in FIG. 2. The low modulus adhesive layer 47 in FIG. 2 permits the two rigidizers 41 and 42 to expand at different rates while maintaining a unitary structure.

Referring now to FIG. 3, an enlarged, or expanded, view of a portion of the assemblies 10 and 40 in FIGS. 1 and 2 is illustrated with identical reference numerals being utilized to identify corresponding structures. FIG. 3, a portion of a rigidizer plate corresponding to either the rigidizer plate 25 in FIG. 1 or the rigidizer plate 42 in FIG. 2 is illustrated as being bonded to the surface 24 of the second portion 13 of the flexible substrate 11. A layer of bonding material 50 provides this bonding function wherein preferably this bonding material is a low modulus adhesive having a modulus of 1000 or less psi. In addition, a portion of a rigidizer plate corresponding to the plates 25 or 41 is illustrated as being bonded by a similar or identical low modulus adhesive 51 to the bottom surface 23 of the first portion 12 of the flexible substrate 119. The layer 47 in FIG. 2 also comprises this same low modulus adhesive. All other interconnections and structures 10 shown in FIG. 3 are identical to those shown in FIGS. 1 and 2.

The essence of the low modulus adhesive Layers 50 and 51 shown in FIG. 3 is to provide an adaptable and flexible bond between the rigidizer plate(s) and the flexible substrate 11 so as to take up any stresses that might be thermally induced between the flexible substrate 11 and the rigidizer because of the inherent difference in the temperature coefficients of expansion of the flexible substrate and the metal rigidizer plate(s). Metal rigidizer plates, or at least plates having substantial thermally conductive properties and being rigid in structure are preferred for the plates 25, 41 and 42. But since these plates substantially differ in their temperature coefficient of expansion from the flexible substrate 11, the die 19 and circuit board 31, the portion of the carrier structure shown FIG. 3 contemplates providing a low modulus adhesive to bond the flexible substrate 11 to associated rigidizer plate(s). In this manner, thermal stresses will be taken up by the give provided by the low modulus adhesive layers 50 and 51. Preferably this low modulus adhesive will be thermally conductive and have high temperature properties so as to survive the soldering processes involved in providing the connections 22 and 28. Thus a preferred composition for this adhesive is a silicone type adhesive. Other low modulus types of adhesive, such as pressure sensitive tape and other acrylic adhesives, are not preferred. Providing a low modulus (less than 1000 psi) adhesive is contrasted with epoxy or rigid type adhesives having a modulus of substantially more than 1000 psi.

What has been described in connection with FIGS. 1 and 2 is a semiconductor device carrier assembly in which a semiconductor device or semiconductor component is mounted on top of a flexible substrate and is interconnected by the flexible substrate to a mother printed circuit board 31 by virtue of a wrap around connection of the flexible substrate forming a U-shaped configuration around a central rigidizer plate(s). The rigidizer plate facilitates handling of the carrier until its mating connection to the mother circuit board 31. The rigidizer also facilitates thermal transfer characteristics so as to enable power dissipation by the semiconductor devices to travel through the rigidizer, through the second portion 13 of the flexible substrate through the large solder ball connections 28 and into the circuit board 31 and preferable therethrough to a large heat sink. The flexible substrate and U-shaped configuration thereof eliminates the need for through-hole connections to essentially connect the very small bonding pads on the semiconductor devices 19 to the much larger conventional bonding pads 29 on the printed circuit board 31. Also very fine line geometries, while needed for the flexible substrate metalizations, are now not needed for the circuit board 31 since larger bonding pads 29 can be used.

The use of two differing TCE rigidizer plates for the FIG. 2 assembly 40 provides improved reliability by minimizing thermal stress since the TCE of the rigidizer 41 will substantially match the TCE of the semiconductor devices 19 and the TCE of the rigidizer 42 will substantially match that of the printed circuit board 31. The use of a low modulus adhesive for the layer 47 in FIG. 2, as well as for the layers 50 and 51 in FIG. 3, also reduces thermal stress and provides a more reliable semiconductor carrier assembly. These low modulus adhesives tend to absorb and to compensate for any thermal mismatch. Thus with the use of such a low modulus adhesive, even the single rigidizer plate structure of the assembly 10 shown in FIG. 1 experiences improved reliability, and the carrier assembly 40 in FIG. 2 experiences additional reliability improvements due to the low modulus adhesive layers 50 and 51.

Prior semiconductor device carriers have not utilized the multiple differing TCE rigidizer structure used in the assembly 40, and prior semiconductor device carrier assemblies which include a mother circuit board have not utilized flex circuit substrates configured in a U-typed configuration as contemplated herein and also have not suggested the use of low modulus adhesives for such semiconductor device/die carrier assemblies. It should be noted that for direct mounting of semiconductor dies on the flexible substrate 11, substantial temperatures may exist during normal operation of the semiconductor devices. Thus very large gradients in temperature may exist thus creating large differences in actual thermal expansion even if thermal expansion coefficients of the materials are relatively close to one another. The structural configurations and materials suggested herein will minimize these thermal stresses as well as providing a semiconductor device carrier structure that is easy to manufacture using conventional techniques since manufacturing fine line flexible substrate circuits is a conventional technique readily achieved in the circuit industry.

While we have shown and described specific embodiments of the present invention, further modifications and improvements will occur to those skilled in the art. While the above described preferred embodiment illustrates solder bonding of semiconductor die to the top surface 14 of a flexible substrate 11, several aspects of the present invention also apply if the semiconductor die is conductively adhesively bonded or if the die is die bonded onto the flexible substrate top surface 14 and wire bonds are used to connect the semiconductor die to the metalized areas 16 on the flexible substrate. Also, preferably there is a conventional under encapsulation adhesive provided between the surface 20 of the die and the surface 14 of the flexible substrate 11, for sealing the die and supporting the solder bumps 22. All such modifications which retain the basic underlining principles disclosed and claimed herein are within the scope of this invention.

We claim:

1. Semiconductor carrier assembly, comprising:

a flexible substrate having first and second portions, each of said first and second portions having a top surface with a plurality of electrically isolated metalized areas thereon and a bottom surface, said flexible substrate having electrical interconnection paths connecting at least some of said plurality of metalized areas on said top surface of said first portion to at least some of said plurality of metalized areas on said top surface of said second portion;

at least one semiconductor device mounted to said first portion top surface and electrically connected to said at least some of said metalized areas on said first portion top surface;

at least one rigidizer plate, said bottom surface of said first portion of said flexible substrate mounted to said first rigidizer plate and said second portion of said flexible substrate mounted such that said bottom surface of said second portion of said flexible substrate faces and is spaced apart from said bottom surface of said first portion of said flexible substrate such that said flexible substrate has a generally U-shaped configuration disposed about said rigidizer plate with said rigidizer plate positioned in the notch of said U; and a circuit board having metalized areas on a top surface thereof which is mounted to said second portion top surface, wherein electrically conductive connections bond and electrically connect said metalized areas on the top surface of said circuit board to some of said metalized areas on the second portion top surface of said flexible substrate.

2. Semiconductor carrier assembly according to claim 1 wherein said semiconductor device comprises a semiconductor die having a plurality of separate bonding pads on a surface of the die each of said bonding pads being connected to an associated one of said metalized areas on the top surface of said first portion of said flexible substrate.

3. Semiconductor carrier assembly according to claim 2 wherein said semiconductor die has its bonding pads soldered to said associated ones of said metalized areas of the top surface of said first portion of said flexible substrate by individual solder connections.

4. Semiconductor carrier assembly according to claim 3 wherein said circuit board top surface is adjacent to and substantially parallel to said top surface of said second portion of said flexible substrate.

5. Semiconductor carrier assembly according to claim 4 wherein said flexible substrate first portion bottom surface is bonded to said first rigidizer plate by a low modulus adhesive having a modulus of less than 1000 psi.

6. Semiconductor carrier assembly according to claim 5 wherein said low modulus adhesive comprises a silicone adhesive.

7. Semiconductor carrier assembly according to claim 1 wherein said circuit board top surface is adjacent to and substantially parallel to said top surface of said second portion of said flexible substrate.

8. Semiconductor carrier assembly according to claim 1 which includes at least a second rigidizer plate, each of the first and second rigidizer plates having a temperature coefficient of expansion (TCE), the temperature coefficient of expansion of each of the rigidizer plates being substantially different from one another, and wherein said bottom surface of said second portion of said flexible substrate is mounted to said second rigidizer plate.

9. Semiconductor carrier assembly according to claim 8 wherein said first and second rigidizer plates are substantially parallel to one another and each has a major planar surface parallel to and facing one another.

10. Semiconductor carrier assembly according to claim 9 wherein said first and second rigidizer plates are positioned adjacent one another and wherein said major planar surfaces of said rigidizer plates are bonded to each other.

11. Semiconductor carrier assembly according to claim 10 which includes a low modulus adhesive positioned between said major planar surfaces of said first and second rigidizer plates, said adhesive bonding said major planar surfaces to each other.

12. Semiconductor carrier assembly according to claim 8 wherein said semiconductor device and said circuit board each have substantially different temperature coefficients of expansion (TCE's), and wherein the first rigidizer plate TCE substantially matches the TCE of said semiconductor device and the second rigidizer plate TCE substantially matches the TCE of said circuit board.

13. Semiconductor carrier assembly according to claim 12 wherein said semiconductor device comprises a semiconductor die mechanically and electrically connected to said first portion top surface of said flexible substrate by a plurality of solder connections forming electrical interconnections and wherein said circuit board is parallel to and connected to said second portion top surface of said flexible substrate by a plurality of solder connections providing electrical connections therebetween.

14. Semiconductor carrier assembly, comprising;
a flexible substrate having first and second portions, each of said first and second portions having a top surface with a plurality of electrically isolated solderable metalized areas thereon and a bottom surface, said flexible substrate having electrical interconnection paths connecting at least some of said plurality of metalized areas on said top surface of said first portion to at least some of said plurality of metalized areas on said top surface of said second portion;
at least one semiconductor device mounted to said first portion top surface and soldered to said at least some of said solderable areas on said first portion top surface;
at least one rigidizer plate, said bottom surface of said first portion of said flexible substrate mounted to said first rigidizer plate and said second portion of said flexible substrate mounted such that said bottom surface of said second portion of said flexible substrate faces and is spaced apart from said bottom surface of said first portion of said flexible substrate such that said flexible substrate has a generally U-shaped configuration disposed about said rigidizer plate with said rigidizer plate positioned in the notch of said U; and
a circuit board having solderable areas on a surface thereof which is mounted to said second portion top surface, wherein solder connections bond and electrically connect said solderable areas on the top surface of said circuit board to some of said solderable areas on the second portion top surface of said flexible circuit.

15. Semiconductor carrier assembly, comprising;
a flexible substrate having first and second portions, each of said first and second portions having a top surface with a plurality of electrically isolated metalized areas thereon and a bottom surface, said flexible substrate having electrical interconnection paths connecting at least some of said plurality of metalized areas on said top surface of said first portion to at least some of said plurality of metalized areas on said top surface of said second portion;
at least one semiconductor device mounted to said first portion top surface and electrically connected to said at least some of said metalized areas on said first portion top surface;
at least one rigidizer plate, said bottom surface of said first portion of said flexible substrate mounted to said first rigidizer plate and said second portion of said flexible substrate mounted such that said bottom surface of said second portion of said flexible substrate faces and is spaced apart from said bottom surface of said first portion of said flexible substrate such that said flexible substrate has a generally U-shaped configuration disposed about said rigidizer plate with said rigidizer plate positioned in the notch of said U; and
at least a second rigidizer plate, each of the first and second rigidizer plates having a temperature coefficient of expansion (TCE) with the temperature coefficient of expansion of each of the rigidizer plates being substantially different from one another, and wherein said bottom surface of said second portion of said flexible substrate is mounted to said second rigidizer plate.

16. Semiconductor carrier assembly according to claim 15 wherein said first and second rigidizer plates are substantially parallel to one another and each has a major planar surface parallel to and facing one another.

17. Semiconductor carrier assembly according to claim 16 wherein said first and second rigidizer plates are positioned adjacent one another and wherein said major planar surfaces of said rigidizer plates are bonded to each other.

18. Semiconductor carrier assembly according to claim 16 which includes a low modulus adhesive positioned between said major planar surfaces of said first and second rigidizer plates, said adhesive bonding said major planar surfaces to each other.

19. Semiconductor carrier assembly according to claim 18 which includes a circuit component mounted to said second portion top surface of said flexible substrate and electrically connected to at least some of said metalized areas on said second portion top surface.

20. Semiconductor carrier assembly according to claim 19 wherein said semiconductor device and said circuit component each have substantially different temperature coefficients of expansion (TCE's), and wherein the first rigidizer plate TCE substantially matches the TCE of said semiconductor device and the second rigidizer plate TCE substantially matches the TCE of said circuit component.

21. Semiconductor carrier assembly according to claim 20 wherein said semiconductor device comprises a semiconductor die mechanically and electrically connected to said first portion top surface of said flexible substrate by a plurality of solder connections.

22. Semiconductor carrier assembly according to claim 15 wherein said bottom surfaces of said flexible substrate first and second portions are bonded to said first and second rigidizer plates by a low modulus adhesive having a modulus of less than 1000 psi.

23. Semiconductor carrier assembly according to claim 22 wherein said low modulus adhesive comprises a silicone adhesive.

24. Semiconductor carrier assembly, comprising;

a flexible substrate having first and second portions, each of said first and second portions having a top surface with a plurality of electrically isolated solderable metalized areas thereon and a bottom surface, said flexible substrate having electrical interconnection paths connecting at least some of said plurality of metalized areas on said top surface of said first portion to at least some of said plurality of metalized areas on said top surface of said second portion;

at least one semiconductor device mounted to said first portion top surface and soldered to said at least some of said solderable areas on said first portion top surface;

at least one rigidizer plate, said bottom surface of said first portion of said flexible substrate mounted to said first rigidizer plate and said second portion of said flexible substrate mounted such that said bottom surface of said second portion of said flexible substrate faces and is spaced apart from said bottom surface of said first portion of said flexible substrate such that said flexible substrate has a generally U-shaped configuration disposed about said rigidizer plate with said rigidizer plate positioned in the notch of said U; and at least a second rigidizer plate, each of the first and second rigidizer plates having a temperature coefficient of expansion (TCE) with the temperature coefficient of expansion of each of the rigidizer plates being substantially different from one another, and wherein said bottom surface of said second portion of said flexible substrate is mounted to said second rigidizer plate.

* * * * *

UNITED STATES PATENT AND TRADEMARK OFFICE
CERTIFICATE OF CORRECTION

PATENT NO.   : 5,386,341
DATED        : January 31, 1995
INVENTOR(S)  : William L. Olson, David W. Currier,
               Tomasz L. Klosowiak, Mark Fulcher It is certified that error appears in the above-indentified patent and that said Letters Patent is hereby corrected as shown below:

Claim 14, Col. 7, line 61, after "on a" insert --top--.

Signed and Sealed this

Twentieth Day of February, 1996

Attest:

BRUCE LEHMAN

*Attesting Officer*      *Commissioner of Patents and Trademarks*